(12) United States Patent
Fitz et al.

(10) Patent No.: US 11,900,030 B2
(45) Date of Patent: Feb. 13, 2024

(54) SYSTEMS AND METHODS FOR THE DESIGN AND ANALYSIS OF STRUCTURAL CONNECTIONS

(71) Applicant: Hilti Aktiengesellschaft, Schaan (LI)

(72) Inventors: Mario Fitz, Schaan (LI); Daphne Rocha, Schaan (LI); Laura Giulietti, Schaan (LI); Joerg Appl, Kaufering (DE)

(73) Assignee: Hilti Aktiengesellschaft, Schaan (LI)

( * ) Notice: Subject to any disclaimer, the term of this patent is extended or adjusted under 35 U.S.C. 154(b) by 18 days.

(21) Appl. No.: 16/682,024

(22) Filed: Nov. 13, 2019

(65) Prior Publication Data
US 2020/0151292 A1    May 14, 2020

Related U.S. Application Data

(60) Provisional application No. 62/760,089, filed on Nov. 13, 2018.

(51) Int. Cl.
*G06F 30/23* (2020.01)
(52) U.S. Cl.
CPC .................................... *G06F 30/23* (2020.01)
(58) Field of Classification Search
CPC ...................................................... G06F 30/23
See application file for complete search history.

(56) References Cited

U.S. PATENT DOCUMENTS

2007/0288210 A1*  12/2007  Powell .................... G06T 17/20
703/2

OTHER PUBLICATIONS

Wald (Wald, F., Šabatka, L., Kabeláč, J., Kolaja, D., & Pospíšil, M. (2015). Structural Analysis and Design of Steel Connections Using Component Based Finite Element Model (CBFEM). Journal of Civil Engineering and Architecture, 9, 895-901.) (Year: 2015).*
Tsavdaridis (Tsavdaridis, K. D., Shaheen, M. A., Baniotopoulos, C., & Salem, E. (Feb. 2016). Analytical approach of anchor rod stiffness and steel base plate calculation under tension. In Structures (vol. 5, pp. 207-218). Elsevier.) (Year: 2016).*

* cited by examiner

*Primary Examiner* — Bijan Mapar
(74) *Attorney, Agent, or Firm* — Leydig, Voit & Mayer, Ltd.

(57) ABSTRACT

A method includes arranging, via a processor, a design layout of a plurality of visualization objects representing a plurality of structural components of a structural system. The method includes receiving, via the processor, one or more input parameters for each visualization object. Each input parameter corresponds to a parameter of the represented structural component. The method includes generating, via the processor, a model of the design layout based at least in part on boundary conditions calculated from the structural components. The method also includes generating, via the processor, an updated layout of the visualization components based at least in part on the results of the model and generating, via the processor, a design report of the updated layout. The design report comprises instructions on arranging the structural components of the structural system.

16 Claims, 4 Drawing Sheets

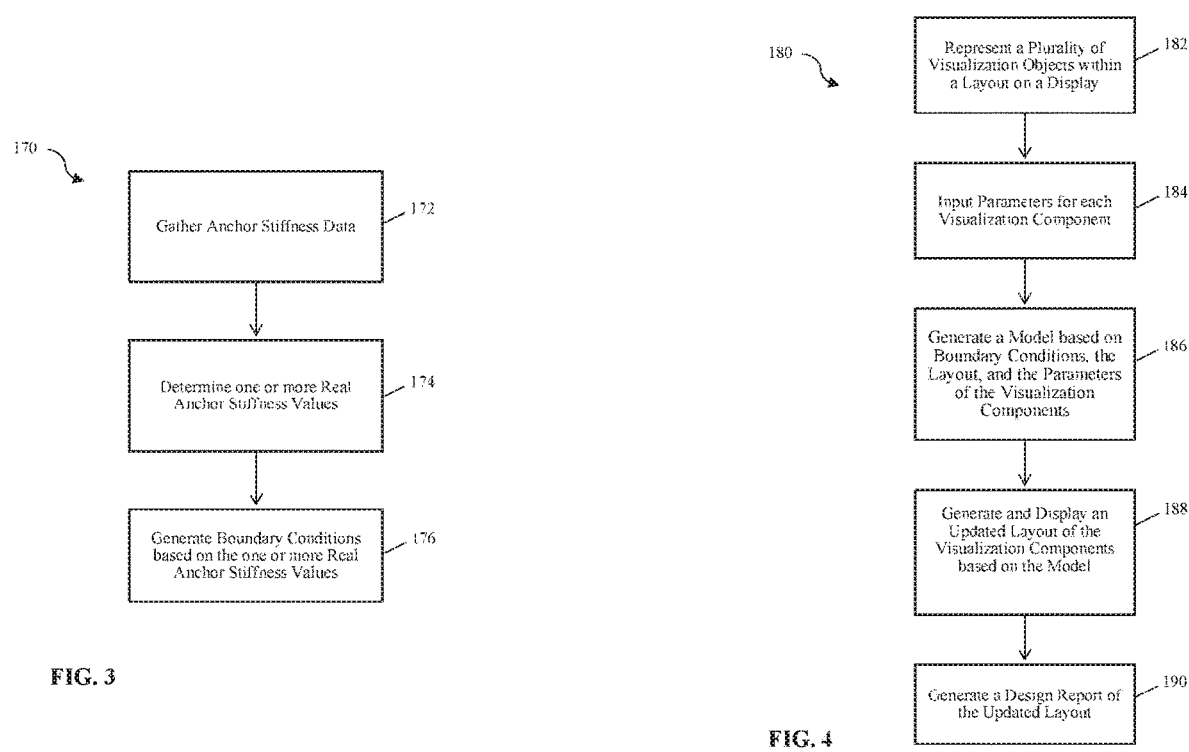

SYSTEMS AND METHODS FOR THE DESIGN AND ANALYSIS OF STRUCTURAL CONNECTIONS

CROSS-REFERENCE TO RELATED APPLICATIONS

Figure 1:
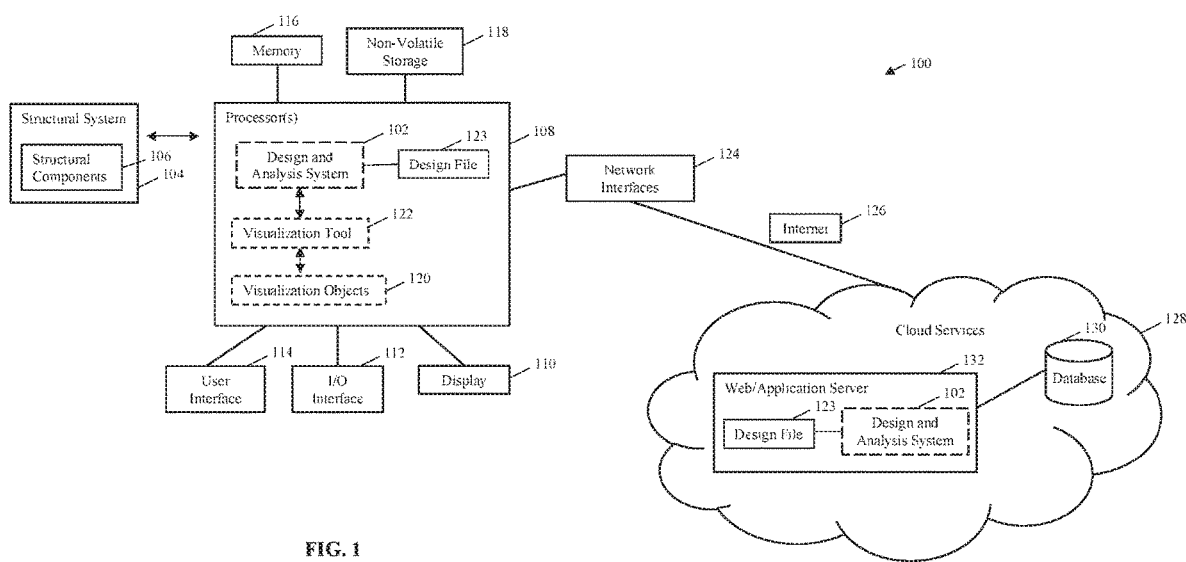

This patent application claims the benefit of U.S. Provisional Patent Application No. 62/760,089, filed Nov. 13, 2018, which is incorporated herein by reference.

BACKGROUND OF THE INVENTION

The present disclosure relates generally to the field of construction, and more particularly to the design and analysis of structural systems.

Structural systems are generally designed and built so that they are connected to the ground via a foundation. Typically, components of the structural systems are formed of steel while the foundation is made of concrete. To properly transfer loads acting on the structural system to the ground, a component of the structural system (e.g., a beam, a column, etc.) is coupled to the foundation. For example, a steel component of the structure may be welded to a baseplate, strengthened with stiffeners, and may then be fixed to a base material (e.g., concrete, masonry, etc.) of the foundation with one or more anchoring components. In particular, the relationships between these components must be designed such that the full connection supports the acting loads. Furthermore, the design assumptions for the full connection should follow the various guidelines and regulations established for designing and building structural systems.

Accordingly, the present embodiments are related to related to improved systems and methods for designing structural systems. Furthermore, the present embodiments are generally related to analyzing designed structural systems to ensure that they meet certain established guidelines and regulations without contradictions.

BRIEF SUMMARY OF THE INVENTION

Certain embodiments commensurate in scope with the originally claimed subject matter are summarized below. These embodiments are not intended to limit the scope of the claimed subject matter, but rather these embodiments are intended only to provide a brief summary of possible forms of the subject matter. Indeed, the subject matter may encompass a variety of forms that may be similar to or different from the embodiments set forth below.

In a first embodiment, a method includes arranging, via a processor, a design layout of a plurality of visualization objects representing a plurality of structural components of a structural system. The method includes receiving, via the processor, one or more input parameters for each visualization object. Each input parameter corresponds to a parameter of the represented structural component. The method includes generating, via the processor, a model of the design layout based at least in part on boundary conditions calculated from the structural components. The method also includes generating, via the processor, an updated layout of the visualization components based at least in part on the results of the model and generating, via the processor, a design report of the updated layout. The design report comprises instructions on arranging the structural components of the structural system.

BRIEF DESCRIPTION OF THE SEVERAL VIEWS OF THE DRAWING(S)

Figure 2:
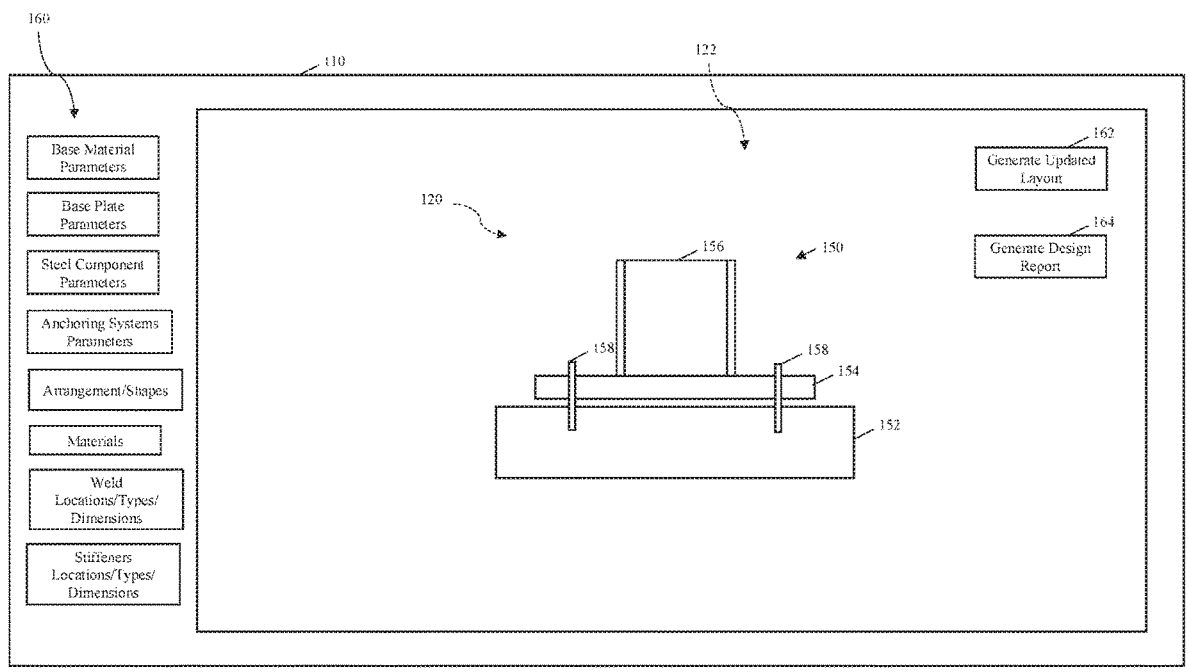
Figure 5:
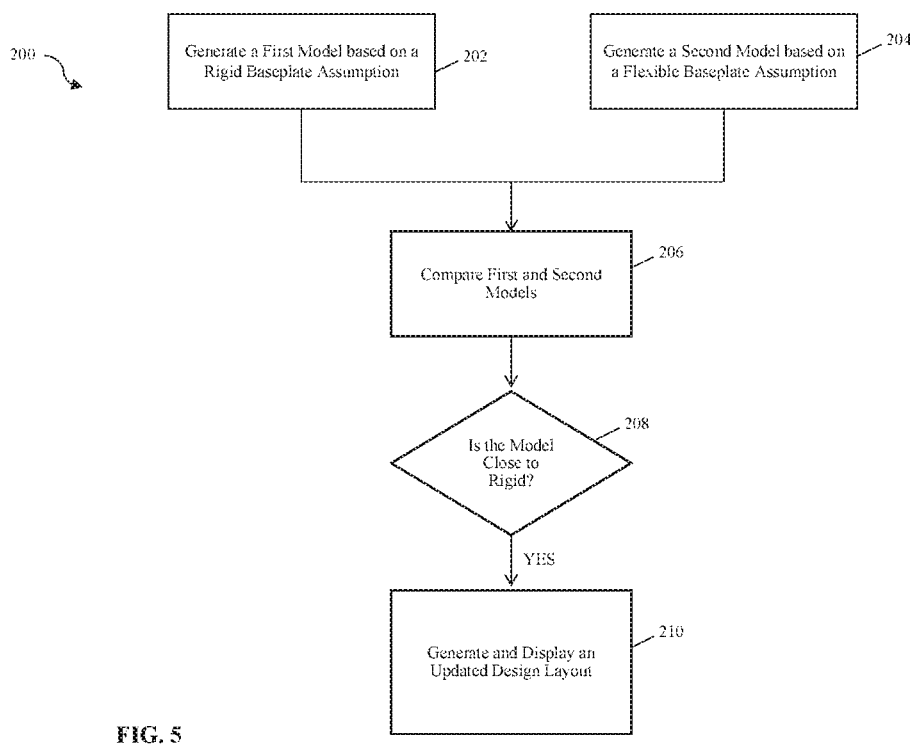

These and other features, aspects, and advantages of the present disclosure will become better understood when the following detailed description is read with reference to the accompanying drawings in which like characters represent like parts throughout the drawings, wherein:

FIG. 1 is a block diagram of an embodiment of a design and analysis system utilized to determine a design layout of a base material, a base plate, a steel component, and one or more anchoring systems, in accordance with aspects of the present disclosure;

FIG. 2 is an embodiment of a visualization tool for the design and analysis system of FIG. 1, where an operator arranges one or more visualization components into a design layout and the design and analysis system generates an updated design layout and a design report; and FIG. 3 is a method of an embodiment of the design and analysis system of FIG. 1, where the method includes generating boundary conditions, in accordance with aspects of the present disclosure;

FIG. 4 is a method of an embodiment of the design and analysis system of FIG. 1, where the method includes generating an updated design layout of the base material, the base plate, the steel component, and the one or more anchoring systems, in accordance with aspects of the present disclosure; and FIG. 5 is a method of an embodiment of the design and analysis system of FIG. 1, where the method includes comparing a first design layout with a second design layout to generate an updated design layout and design report.

DETAILED DESCRIPTION OF THE INVENTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

FIG. 1 is a block diagram of an embodiment of a construction system 100 having a design and analysis system 102 that is utilized to visualize and analyze a design layout of a structural system 104. In certain embodiments, the design and analysis system 102 is utilized to generate an updated design layout of the structural system 104. In the illustrated embodiments, the structural system 104 may be any structure on a real-world construction site that includes structural components 106 to support loads and environmental forces. For example, the structural components 106 may include a base material (e.g., concrete), a base plate, a steel component, and one or more anchoring systems. However, it should be noted that the structural system 104 may include any real-world construction equipment or components, such as any component that needs to be visualized and analyzed with respect to other components within the structural system 104.

In certain embodiments, the construction system 100 may include a processor 108, a display 110, an I/O interface 112, a user interface 114, a memory 116 and a non-volatile storage 118. In certain embodiments, the design and analysis system 102 is configured to represent the structural system 104, such as the structural components 106, via visualization objects 120 within a visualization tool 122 (e.g., design environment). The visualization objects 120 may be executed by processing circuitry to provide simulated functionality similar or identical to the actual structural components 106 within the real world. Further, in certain embodiments, the visualization objects 120 may be executed by processing circuitry to provide a visualization of the layout, design, and structural relationships between the structural components 106. The visualization objects 120 may include code that is stored within the memory 116 and executed by the processor 108, and the display 110 may be configured to depict representations of the structural components 106.

In certain embodiments, an operator may utilize the visualization tool 122 to build or design a representation of the structural system 104 for analysis. The layout of the visualization tool 122 may be "free-form," and may allow an operator to easily select, move, position the visualization objects 120 into an appropriate arrangement. In certain embodiments, the operator may enter, via the user interface 114 and/or the I/O interface 112, one or more parameters associated with each structural component 106. For example, each of the structural components 106 may have unique parameters such as different materials, shapes, dimensions, arrangements, quantities, and/or properties (e.g., strength, stiffness, forces, deformation, etc.). Accordingly, the visualization objects 120 may be selected from a library and/or customized by the operator with specific parameters and properties. In this manner, the operator utilizes the visualization tool 122 to design a virtual design layout that is a representation of the actual physical layout of the structural system 104 (or the actual desired layout of the structural system 104).

In certain embodiments, the processor 108 may be configured to generate a model of the designed layout to determine the feasibility of the designed layout. For example, in certain embodiments, the designed layout of the structural components 106 may be tested to determine whether the designed layout follows the guidelines and regulations established for designing and building structural systems. Accordingly, the processor 108 may be configured to generate a model by executing a flexible, non-linear calculation based on a Component Based Finite Element Model (CBFEM). In particular, the processor 108 may be configured to generate the model based in part on the parameters selected for each structural component 106, the layout and arrangement of the structural components 106, and various pre-determined boundary conditions. Based on the results of the model, the designed layout may be updated and/or corrected. The updated design layout may be captured in a design report that includes the updated design layout and results from the CBFEM model. In certain embodiments, the updated design layout may be depicted on the display 110 via the visualization tool 122.

In certain embodiments, the design file 123 may be transmitted via wired or wireless communications and various network interfaces 124 to a cloud-based computing device 128. In certain embodiments, the cloud-based computing device 128 may be a service provider providing cloud analytics, cloud-based collaboration and workflow systems, distributed computing systems, expert systems and/or knowledge-based systems. In certain embodiments, the cloud-based computing device 128 may be a data repository that is coupled to an internal or external global database 130. In certain embodiments, the cloud-based computing device 128 includes a web/application server 132 that includes the design and analysis system 102. In certain embodiments, the design file 123 may be evaluated or re-evaluated through the cloud-based computing device 128 and tested for accuracy and feasibility. In certain embodiments, the design file 123 may be shared to other users for increased work-flow productivity and efficiency.

FIG. 2 is an embodiment of a visualization tool 122 for the design and analysis system 102 of FIG. 1, where an operator arranges one or more visualization objects 120 into a design layout 150. Further, the design and analysis system 102 generates an updated design layout 162 and/or the design file 123.

In certain embodiments, the operator may utilize the visualization tool 122 (e.g., design environment) on the display 110 to create a designed layout 150. In particular, the designed layout may be a representation of the actual real-world structural components 106, such as the physical structural components associated with structural systems 194 on a construction site. The visualization tool 122 may allow the operator to select visualization objects 120 that are representative of the structural components 106 in both function and arrangement. For example, the structural components 106 may include a base material (e.g., concrete), a base plate, a steel component, and one or more anchoring systems. In certain embodiments, the operator may select visualization objects 120 that are representative of a base material object 152, a base plate object 154, a steel component object 156, and one or more anchoring systems objects 158. The operator may arrange the visualization objects 120 in any configuration, and may be able to customize the parameters of each object 120 to more accurately reflect the arrangement and function of the structural component 106. For example, each of the structural components 106 may have unique parameters such as different materials, shapes, dimensions (length, circumference, width, thickness, height, etc.), arrangements, quantities, and/or properties (e.g., strength, stiffness, forces, deformation, etc.). Accordingly, in certain embodiments, the operator may customize the visualization objects 120 by either selecting and/or entering various parameters into the visualization tool 122 by using the customization features 160. For example, the operator may select a material for the base material object 152 (e.g., concrete, masonry, etc.), select parameters for the base plate object 154 (e.g., dimensions, material, strength, flexibility, stiffness, etc.), select parameters for the steel component object 156 (e.g., material, position, number and/or position of stiffeners, arrangement or shape, dimensions, thickness, etc.), and select parameters for the one or more anchoring systems objects 158 (e.g., type, number and arrangement, dimensions, stiffness, location, weld type, weld location, weld thickness, etc.). Furthermore, the operator may customize the overall connection of the structural components 106 by selecting various environmental forces, loads, stresses and strains that may be imposed on the structural components 106 in the real-world. In certain embodiments, the visualization objects 120 may be depicted in 2-D or 3-D, with various forces imparted on the structural components 106 represented via shades of colors. In certain embodiments, the operator can choose from one or more design templates and/or may customize a template layout. In certain embodiments, specific visualization objects 120 may be preloaded within the design and analysis system with preset parameters.

In certain embodiments, after designing and/or customizing the design layout 150, the operator may run various models on the designed layout and selected parameters. For example, the operator may generate a model 162 by executing a flexible, non-linear calculation based on a Component Based Finite Element Model (CBFEM). In particular, the processor 108 may be configured to generate the model based in part on the parameters selected for each structural component 106, the layout and arrangement of the structural components 106, and various pre-determined boundary conditions. Based on the results of the model, the designed layout may be updated and/or corrected. Specifically, the operator may generate the design report 164, store and edit a design file, import or export data, etc. In certain embodiments, access to the design and analysis system 102 may be determined by a user name and/or password.

FIG. 3 is a method 170 of an embodiment of the design and analysis system 102 of FIG. 1, where the method 170 includes generating boundary conditions, in accordance with aspects of the present disclosure. While the illustrated embodiment describes generating boundary conditions based on anchoring systems that may be used within the construction system 100, it should be noted that the same method may be utilized to calculate boundary conditions for any type of structural component 106 that are actually used within construction sites and within structural systems 104.

In certain embodiments, the method 170 includes gathering anchor stiffness data from various anchoring systems (e.g., structural components 106) that may be utilized within the construction system 100 (block 172). Further, the method 170 includes determining one or more real anchor stiffness values based on the collected data (block 174). In certain embodiments, the real anchor stiffness values may be determined from anchor stiffness data that is gathered from a plurality of tests conducted for each type of specific anchoring system and for each specific setting condition (e.g., embedment depth, base material, etc.). For example, a number of different tests with a variety of test variables (e.g., embedment depth, environmental forces, etc.) may be conducted for each specific type of anchoring system. With the information that is gathered, one anchor stiffness value (a real anchor stiffness value) may be determined for a specific type of anchoring system.

In certain embodiments, based on the calculated real anchor stiffness values, the method 170 includes generating boundary conditions (block 176). In certain embodiments, the design and analysis system 102 may utilize the generated boundary conditions to determine load behavior of the full connection (e.g., designed layout with the base material, the base plate, the steel component, and the one or more anchoring systems). In addition, as further described with respect to FIG. 4, the boundary conditions may be utilized to generate models that simulate load behavior in a real-world environment. In this manner, the design and analysis system 102 may be configured to determine whether a designed layout (e.g., full connection) meets the load behavior regulations and guidelines established in the industry.

FIG. 4 is a method 180 of an embodiment of the design and analysis system 102 of FIG. 1, where the method 180 includes generating a design report 164 of an updated design layout 162. In certain embodiments, the method 180 includes representing a plurality of visualization objects 120 within a designed layout 150 on the display 110 (block 182). In particular, the plurality of visualization objects 120 may correspond to a plurality of structural components 106. For example, each visualization object 120 arranged within the designed layout 150 may be representative of a real-world structural component 106 such as, for example, a concrete base material, a baseplate, a steel structural component, one or more anchoring system, etc. In certain embodiments, the anchoring system object 158 chosen for the design layout 150 may have a real anchor stiffness value calculated from one or tests performed specifically for that anchoring system.

Further, in certain embodiments, the method 180 includes an operator inputting one or more parameters for each visualization object 120 (block 184). In certain embodiments, the method 180 includes the design and analysis system 102 executing instructions to generate a model by calculating a flexible, non-linear calculation based on a Component Based Finite Element Model (CBFEM). In particular, the model may be generated based in part on the boundary conditions for the structural components 106, the designed layout 150, and the selected and/or customized parameters for each visualization object 120 (block 186). In certain embodiments, the method includes generating and displaying on the display 110 an updated layout 162 of the visualization components 120 based in part on the generated model (block 188). Further, in certain embodiments, the method 180 includes generating a design report 164 based on the updated layout 162 (block 190). In certain embodiments, the design report 164 may be transmitted to other computing devices as the design file 123. In particular, the design report 164 may be configured to provide instructions and/or guidance on the designed layout 150 and the real-world situation.

FIG. 5 is a method 200 of an embodiment of the design and analysis system 102 of FIG. 1, where the method 200 includes comparing a first model with a second model to generate the updated design layout 162 and the design report 164. In certain embodiments, the design and analysis system 102 may be configured to run one or more different types of models to determine an ideal updated design layout 162.

For example, the method 200 includes generating a first model based on a first non-linear FEM calculation utilizing the assumption that the base plate is rigid (e.g., rigid baseplate assumption) (block 202). Further, the method 200 includes generating a second model based on a second non-linear FEM calculation utilizing the assumption that the base plate is flexible (e.g., flexible baseplate assumption) (block 204). In other words, the design and analysis system 102 may be configured to generate two models based on two independent non-linear FEM calculations—a first utilizing a rigid baseplate assumption and a second utilizing a flexible base plate assumption. The method 200 includes comparing the two models (block 206) and determining which model solution (and/or which combination of the models) is closer to the theoretical rigid baseplate assumption (block 208). Based on the comparison, the design and analysis system 202 may be configured to give guidance on the difference between the theoretical rigid baseplate assumption and the real-world situation. The method 200 includes generating and displaying the updated layout of the visualization components 120 based in part on the comparison between the two models (block 210). The method 200 includes generating a design report 164 based on the updated layout 162. In certain embodiments, the design report 164 may be transmitted to other computing devices as the design file 123. In particular, the design report 164 may be configured to provide instructions and/or guidance on the designed layout 150 and the real-world situation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A method of building a structural system including a plurality of structural components, the method comprising:
    receiving, by a processor configured to operate a visualization tool, input via an interface arrange with the processor, the input comprising instructions for arranging a plurality of visualization objects in a design layout, the visualization objects stored in a member arranged with the processor and executed by the processor in response to the instructions, the visualization objects respectively representing the plurality of structural components of the structural system such that the design layout is a representation of a physical layout of the structural system;
    depicting on a display coupled to the processor, via the visualization tool, a first visualization comprising the design layout;
    receiving, by the processor via the interface, values for at least one parameter for each visualization object in the design layout, wherein each parameter corresponds to a parameter of the represented structural component;
    generating, via the processor, a feasibility model of the design based at least in part on at least one of the design layout and the values for the parameters of the visualization objects in the design layout, wherein generating the feasibility model of the design layout is also based at least in part on predetermined boundary conditions calculated from the structural components, wherein generating the feasibility model of the design layout comprises generating a first model and a second model, respectively, based upon two independent calculations, wherein the first model is based on a first assumption of a structural component of the plurality of structural components of the structural system, wherein the second model is based on a second assumption of the same structural component of the plurality of structural components of the structural system used in the first model, and wherein generating the updated layout comprises comparing the first model with the second model;
    generating, via the processor, an updated layout of the visualization objects in the design layout based at least in part on the feasibility model, wherein at least one of the visualization objects of the updated layout is different from a corresponding visualization object of the design layout; and
    depicting on the display, via the visualization tool, a second visualization comprising the updated layout.

2. The method according to claim 1, wherein the structural components comprise a base material, a baseplate, an anchoring system, and a steel component, and the visualization objects comprise a base material object, a baseplate object, an anchoring system object, and a steel component object.

3. The method according to claim 2, wherein the base material is concrete.

4. The method according to claim 2, wherein receiving values for at least one parameter for each visualization object comprises receiving at least one selection via the interface of a visualization object from a library of visualization objects containing at least one predetermined parameter stored in the memory.

5. The method according to claim 2, wherein receiving values for at least one parameter for each visualization object comprises receiving at least one customized value of at least one parameter of at least one visualization object via the interface.

6. The method according to claim 2, wherein the at least one parameter comprises at least one of a material, a shape, a dimension, a number, an arrangement, and a property of the represented structural component.

7. The method according to claim 1, wherein generating the feasibility model of the design layout is based at least in part on the design layout and the values for the parameters of the visualization objects.

8. The method according to claim 1, wherein generating the feasibility model of the design layout comprises executing, via the processor, a flexible, non-linear calculation based on a Component Based Finite Element Model (CB-FEM).

9. The method according to claim 1, wherein generating the feasibility model of the design layout is based at least in part on determining, by the processor, whether the design layout follows predetermined load behavior regulations for the structural system.

10. The method according to claim 1, wherein generating the feasibility model of the design layout is based at least in part on the design layout and the values for the parameters of the visualization objects.

11. The method according to claim 1, wherein the structural components comprise anchoring systems, and wherein the boundary conditions are calculated from the anchoring systems.

12. The method according to claim 11, wherein calculating boundary conditions from the anchoring systems comprises:
    gathering stiffness data from a plurality of anchoring systems,
    determining an anchor stiffness value based on the stiffness data, and
    generating a boundary condition based in part on the anchor stiffness value.

13. The method according to claim 1, wherein the first model is generated based on a first non-linear FEM calculation, and the second model is generated based on a second non-linear FEM calculation.

14. The method according to claim 1, further comprising:
    generating, via the processor, a design report of the updated layout, wherein the design report comprises instructions on arranging the structural components of the structural system.

15. The method according to claim 1, further comprising:
    generating, via the processor, a design report of the update layout, wherein the design report includes the updated layout and results from the feasibility model.

16. The method according to claim 1, wherein the first assumption is a rigid assumption of the structural component of the plurality of structural components of the structural system, and wherein the second assumption is a flexible assumption of the structural component of the plurality of structural components of the structural system.

* * * * *